United States Patent
Matsumoto et al.

(10) Patent No.: US 10,794,961 B2
(45) Date of Patent: Oct. 6, 2020

(54) INTERNAL STATE ESTIMATING DEVICE

(71) Applicant: Honda Motor Co., Ltd., Tokyo (JP)

(72) Inventors: Yasuo Matsumoto, Saitama (JP);
Tetsuaki Nakano, Saitama (JP);
Masayuki Kawamura, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 105 days.

(21) Appl. No.: 16/190,167

(22) Filed: Nov. 14, 2018

(65) Prior Publication Data
US 2019/0146038 A1 May 16, 2019

(30) Foreign Application Priority Data

Nov. 14, 2017 (JP) .................................. 2017-219398

(51) Int. Cl.
| | |
|---|---|
| G01R 31/389 | (2019.01) |
| G01R 31/382 | (2019.01) |
| B60L 58/16 | (2019.01) |
| H01M 10/48 | (2006.01) |
| G01R 31/392 | (2019.01) |
| B60L 58/12 | (2019.01) |
| B60L 3/12 | (2006.01) |

(52) U.S. Cl.
CPC .............. *G01R 31/389* (2019.01); *B60L 3/12* (2013.01); *B60L 58/12* (2019.02); *B60L 58/16* (2019.02); *G01R 31/382* (2019.01); *G01R 31/392* (2019.01); *H01M 10/482* (2013.01); *B60L 2240/547* (2013.01); *B60L 2240/549* (2013.01); *B60L 2260/44* (2013.01)

(58) Field of Classification Search
CPC .. G01R 31/389; G01R 31/382; G01R 31/392; B60L 58/12; B60L 58/16; B60L 2240/549; B60L 2240/547; G60L 3/12; H01M 10/482; H01M 10/48
See application file for complete search history.

(56) References Cited

U.S. PATENT DOCUMENTS

| | | | | |
|---|---|---|---|---|
| 2015/0127280 A1* | 5/2015 | Baba | ..................... | H01M 10/48 702/63 |
| 2015/0293183 A1* | 10/2015 | Tenmyo | ................ | H02J 7/0021 324/429 |

(Continued)

FOREIGN PATENT DOCUMENTS

JP  WO2016132813  4/2017

*Primary Examiner* — Jeff W Natalini
(74) *Attorney, Agent, or Firm* — JCIPRNET (57) ABSTRACT

An internal state estimating device includes an electrolysis resistance calculating part calculating a post-deterioration resistance value of an electrolysis resistive component using a detection value from a sensor, a reaction resistance calculating part calculating a post-deterioration resistance value of a reaction resistive component using a resistance increase ratio and an initial resistance value of an reaction resistor, wherein the resistance increase ratio is a ratio of the post-deterioration resistance value of the electrolysis resistive component to an initial resistance value of an electrolysis resistor, and a capacitance calculating part calculating a post-deterioration capacitance value of an electric double-layer capacitive component using the resistance increase ratio and an initial capacitance value of the electric double-layer capacitive component.

4 Claims, 7 Drawing Sheets

(56) References Cited

U.S. PATENT DOCUMENTS

2016/0103184 A1\* 4/2016 Kawai ................. G01R 31/367
702/63
2016/0252585 A1\* 9/2016 Baba .................... H02J 7/0021
702/63
2018/0017628 A1\* 1/2018 Takegami .......... G01R 31/3648

\* cited by examiner

INTERNAL STATE ESTIMATING DEVICE

CROSS-REFERENCE TO RELATED APPLICATION

This application claims the priority benefit of Japan application serial no. 2017-219398, filed on Nov. 14, 2017. The entirety of the above-mentioned patent application is hereby incorporated by reference herein and made a part of this specification.

BACKGROUND

Technical Field

The disclosure relates to an internal state estimating device of a battery. More specifically, the disclosure relates to an internal state estimating device that estimates the internal state of a battery which varies with the use thereof.

Description of Related Art

The input and output performance of a secondary battery which is mounted in a hybrid vehicle (HEV), a plug-in hybrid vehicle (PHEV), a battery electric vehicle (BEV), or the like varies depending on the internal state of the secondary battery such as a state of charge, a fully charged capacity, and a resistance. Accordingly, in order to suitably use a secondary battery according to the input and output performance thereof, it is necessary to estimate the internal state of the secondary battery with high accuracy.

Patent Document 1 discloses an invention for estimating two resistive components $R_0$ and $R_1$ and a capacitive component $C_1$ which are parameters for specifying an equivalent circuit of a secondary battery as parameters representing an internal state of a secondary battery. Here, the resistive component $R_0$ corresponds to a resistance value of a series resistor in an equivalent circuit. The resistive component $R_1$ and the capacitive component $C_1$ correspond to a resistance value of a parallel resistor and a capacitance value of a parallel capacitor in an RC parallel circuit which is connected in series to a series resistor in the equivalent circuit. According to the invention described in Patent Document 1, an open-circuit voltage of the secondary battery is estimated during supply of power and a state of charge of the second battery is additionally estimated using the open-circuit voltage.

PATENT DOCUMENTS

[Patent Document 1] WO 2016/132813

In the invention described in Patent Document 1, a value of a time constant $\tau$ which is a product of two parameters $R_1$ and $C_1$ is determined using a map and $R_0$ and $R_1$ of the equivalent circuit parameters are determined using a sequential least squares method. Accordingly, in the invention described in Patent Document 1, variation in the two parameters $R_1$ and $C_1$ for specifying transient characteristics of the secondary battery due to deterioration thereof cannot be estimated with satisfactory accuracy. In the invention described in Patent Document 1, when it is intended to estimate variations of three parameters $R_0$, $R_1$, and $C_1$ using a sequential least squares method, there is a likelihood that a calculation load will be accordingly higher.

SUMMARY

An internal state estimating device (for example, internal state estimating devices 2 and 2A which will be described later) according to the disclosure serves to estimate an internal state of a battery (for example, a battery 1 which will be described later) which has varied with use thereof and includes: a storage part (for example, storage parts 52 and 52A which will be described later) that stores a reference parallel resistive component (for example, an initial resistance value $R_{1\_ini}$ of a reaction resistor 21r which will be described later) and a reference parallel capacitive component (for example, an initial capacitance value $C_{1\_ini}$ of an electric double-layer capacitor 21c which will be described later) in at least one RC parallel circuit included in an equivalent circuit model of the battery; a first internal state estimating part (for example, an electrolysis resistance calculating part 53, a resistance increase ratio calculating part 54, and reaction resistance calculating parts 55 and 55A which will be described later) that calculates one varying component (for example, a post-deterioration resistance value $R_1$ of a reaction resistor 21r which will be described later) from a varying parallel resistive component and a varying parallel capacitive component on the basis of detection values from a sensor (for example, a current sensor 3 and a voltage sensor 4 which will be described later) connected to the battery; and a second internal state estimating part (for example, capacitance calculating parts 56 and 56A which will be described later) that calculates the other varying component (for example, a post-deterioration capacitance value $C_1$ of an electric double-layer capacitor 21c which will be described later) from the varying parallel resistive component and the varying parallel capacitive component such that a product of the reference parallel resistive component and the reference parallel capacitive component is equal to a product of the one varying component and the other varying component.

DESCRIPTION OF THE EMBODIMENTS

The disclosure is provides an internal state estimating device that can accurately estimate an internal state of a battery while curbing an increase in a calculation load.

In a case, the equivalent circuit model may include N (where N is an integer equal to or greater than 2) stages of RC parallel circuits (for example, RC parallel circuits 21 to 2N) which will be described later), the storage part may store a reference parallel resistive component (for example, initial resistance values $R_{1\_ini}$ to $R_{N\_ini}$ which will be described later) and a reference parallel capacitive component (for example, initial capacitance values $C_{1\_ini}$ to $C_{N\_ini}$ which will be described later) in each stage of RC parallel circuit, the first internal state estimating part may calculate one varying component (for example, post-deterioration resistance values $R_1$ to $R_N$ which will be described later) of a varying parallel resistive component and a varying parallel capacitive component in each stage of RC parallel circuit, and the second internal state estimating part may calculate the other varying component (for example, post-deterioration capacitance values $C_1$ to $C_N$ which will be described later) such that a product of the reference parallel resistive component and the reference parallel capacitive component in each stage of RC parallel circuit is equal to a product of the one varying component and the other varying component.

In a case, the equivalent circuit model may include a series resistor (for example, an electrolysis resistor 20 which will be described later) which is connected in series to the RC parallel circuit, the storage part may store a reference series resistive component (for example, an initial resistance value $R_{0\_ini}$ of an electrolysis resistor 20 which will be described later), and the first internal state estimating part may calculate a varying series resistive component (for example, a post-deterioration resistance value $R_0$ which will be described later) on the basis of the detection value from the sensors and calculate the one varying component on the basis of a series resistance increase ratio (for example a resistance increase ratio k which will be described later) which is a ratio of the varying series resistive component to the reference series resistive component and the one reference component.

In a case, the varying parallel resistive component may be calculated by multiplying the reference parallel resistive component by the series resistance increase ratio and the varying parallel capacitive component may be calculated by dividing the reference parallel capacitive component by the series resistance increase ratio.

In a case, the internal state estimating device may further include an open-circuit voltage estimating part (for example, an OCV estimating part 57 which will be described later) that estimates an open-circuit voltage of the battery on the basis of a detection value from a voltage sensor (for example, a voltage sensor 4 which will be described later) connected to the battery, the varying series resistive component, the varying parallel resistive component, and the varying parallel capacitive component (for example, $R_0$, $R_1$, and $C_1$ which will be described later) which are calculated by the first and second internal state estimating parts.

In a case, the internal state estimating device may further include a state-of-charge estimating part (for example, an SOC estimating part 58 which will be described later) that estimates a state of charge of the battery on the basis of the open-circuit voltage of the battery estimated by the open-circuit voltage estimating part.

In the internal state estimating device according to the disclosure, an internal state of a battery which varies with use thereof is expressed by an equivalent circuit model including at least one RC parallel circuit. The first internal state estimating part calculates one varying component from a varying parallel resistive component and a varying parallel capacitive component in the RC parallel circuit on the basis of a detection value from a sensor connected to the battery. The second internal state estimating part calculates the other varying component of the varying parallel resistive component and the varying parallel capacitive component. As will be described later with reference to FIG. 6, a time constant which is a product of the varying parallel resistive component and the varying parallel capacitive component in the RC parallel circuit included in the equivalent circuit model has characteristics that the time constant is substantially constant without varying even when the battery deteriorates with use thereof and. Using these characteristics, the second internal state estimating part calculates the other varying component such that a product of the reference parallel resistive component and the reference parallel capacitive component stored in the storage part is equal to a product of the one varying component and the other varying component. As a result, according to the disclosure, it is possible to accurately estimate the varying parallel resistive component and the varying parallel capacitive component in the RC parallel circuit representing the internal state of the battery while curbing an increase in a calculation load.

In the internal state estimating device according to the disclosure, the internal state of the battery which varies with use thereof is expressed by an equivalent circuit model including N stages of RC parallel circuits of a number equal to or greater than two stages. Accordingly, in the internal state estimating device according to the disclosure, it is possible to more accurately reproduce the internal state of the battery which varies with use thereof using the equivalent circuit model. When the equivalent circuit model is expressed using N stages of RC parallel circuits, the number of parameters of the equivalent circuit model is at least 2N and thus there is a likelihood that the calculation load will increase greatly. On the other hand, in the disclosure, since the other varying component of the varying parallel resistive component and the varying parallel capacitive component in each stage of RC parallel circuit can be calculated under the condition that the time constant of each stage of RC parallel circuit is substantially constant without depending on the variation of the battery as described above, it is possible to accurately estimate the internal state of the battery while curbing an increase in the calculation load.

In the internal state estimating device according to the disclosure, the internal state of the battery which varies with use thereof is expressed by an equivalent circuit model including at least one RC parallel circuit and a series resistor which is connected in series to the RC parallel circuit. The first internal state estimating part calculates a varying series resistive component on the basis of the detection value from the sensor connected to the battery and calculates the one varying component on the basis of a series resistance increase ratio which is a ratio of the varying series resistive component to the reference series resistive component and the one reference component of the RC parallel circuit. Accordingly, it is possible to calculate the varying parallel resistive component or the varying parallel capacitive component of the RC parallel circuit while curbing an increase in the calculation load.

Deterioration of the battery is thought to progress because partial degeneration of an active material occurs and a surface area in which ions can react decreases. The parallel resistive component of the RC parallel circuit is thought to increase in proportion to a decrease in the surface area in which ions can react and the parallel capacitive component is thought to decrease in proportion to a decrease in the surface area in which ions can react. In the internal state estimating device according to the disclosure, using such characteristics of deterioration of the battery, the varying parallel resistive component of the RC parallel circuit is calculated by multiplying the reference parallel resistive component by the series resistance increase ratio and the varying parallel capacitive component is calculated by dividing the reference parallel capacitive component by the series resistance increase ratio. Accordingly, with the internal state estimating device according to the disclosure, it is possible to accurately estimate the internal state of the battery while curbing an increase in the calculation load.

In the internal state estimating device according to the disclosure, an open-circuit voltage of the battery is estimated on the basis of a detection value from a voltage sensor connected to the battery and the varying series resistive component, the varying parallel resistive component, and the varying parallel capacitive component which are calculated as described above. As a result, according to the disclosure, it is possible to accurately estimate the open-circuit voltage of the battery even in a state in which a current flows in the battery.

In the internal state estimating device according to the disclosure, a state of charge of the battery is estimated on the basis of the open-circuit voltage which is estimated as described above. As a result, according to the disclosure, it is possible to accurately estimate the state of charge of the battery even in a state in which a current flows in the battery.

First Embodiment

Hereinafter, a first embodiment of the disclosure will be described with reference to the accompanying drawings.

Figure 1:
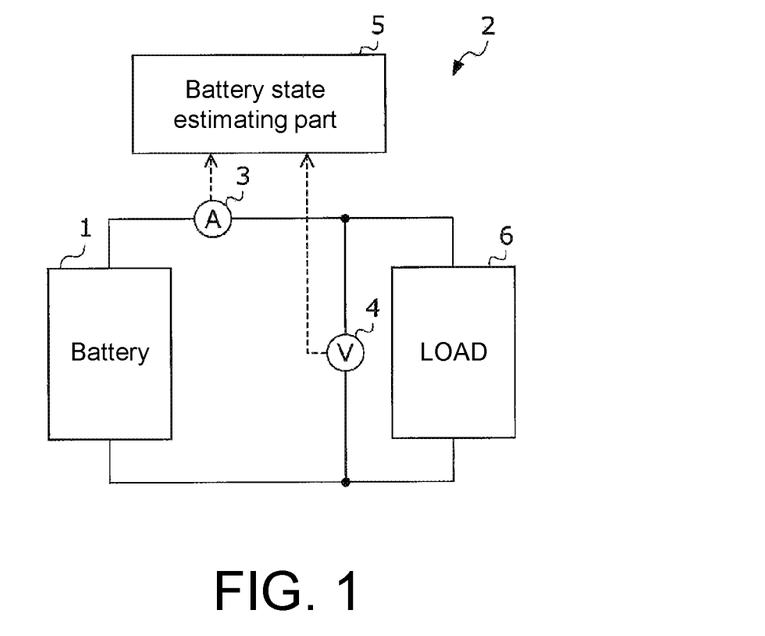
FIG. 1 is a diagram illustrating a configuration of a battery and an internal state estimating device estimating an internal state thereof according to a first embodiment of the disclosure.

FIG. 1 is a diagram illustrating a configuration of a battery 1 and an internal state estimating device 2 estimating an internal state thereof according to this embodiment. The battery 1 and the internal state estimating device 2 are mounted in a vehicle (not illustrated) which travels using electrical energy such as an electric vehicle, a hybrid vehicle, or a fuel-cell vehicle.

The battery 1 is a secondary battery that can carry out both discharging of converting chemical energy into electrical energy and charging of converting electrical energy into chemical energy. For example, a so-called lithium-ion secondary battery that performs charging or discharging using lithium ions moving between a positive electrode and a negative electrode may be used as the battery 1.

The battery 1 is connected to a load 6 including an electric motor that drives driving wheels of the vehicle or an auxiliary machine via a PDU (Power Distribution Unit) which is not illustrated. The PDU supplies (discharges) electric power from the battery 1 to the load 6 or supplies (charges) the battery 1 with electric power acquired by causing the electric motor to function as a power generator depending on the internal state of the battery 1 which is estimated by the internal state estimating device 2, a driving state of the vehicle, or the like.

The internal state estimating device 2 includes a current sensor 3, a voltage sensor 4, and a battery state estimating part 5, and estimates the internal state of the battery 1 which varies with deterioration thereof using such elements.

The current sensor 3 detects a discharging current that flows in the battery 1 when electric power is supplied from the battery 1 to the load 6 or a charging current that flows in the battery 1 when electric power is supplied from the load 6 to the battery 1 at the time of braking of the vehicle or the like, and transmits a signal corresponding to the detection value to the battery state estimating part 5.

The voltage sensor 4 detects a terminal voltage of the battery 1, that is, a potential difference between a positive electrode and a negative electrode of the battery 1 in a state in which the battery 1 is connected to the load 6 and a current flows in the battery 1, and transmits a signal corresponding to the detection value to the battery state estimating part 5.

The battery state estimating part 5 is a microcomputer that takes charge of control associated with estimation of the internal state of the battery 1. The battery state estimating part 5 defines an equivalent circuit model for a battery system including the battery 1, the current sensor 3, and the voltage sensor 4, and estimates the internal state of the battery 1 on the basis of the equivalent circuit model.

Figure 2:
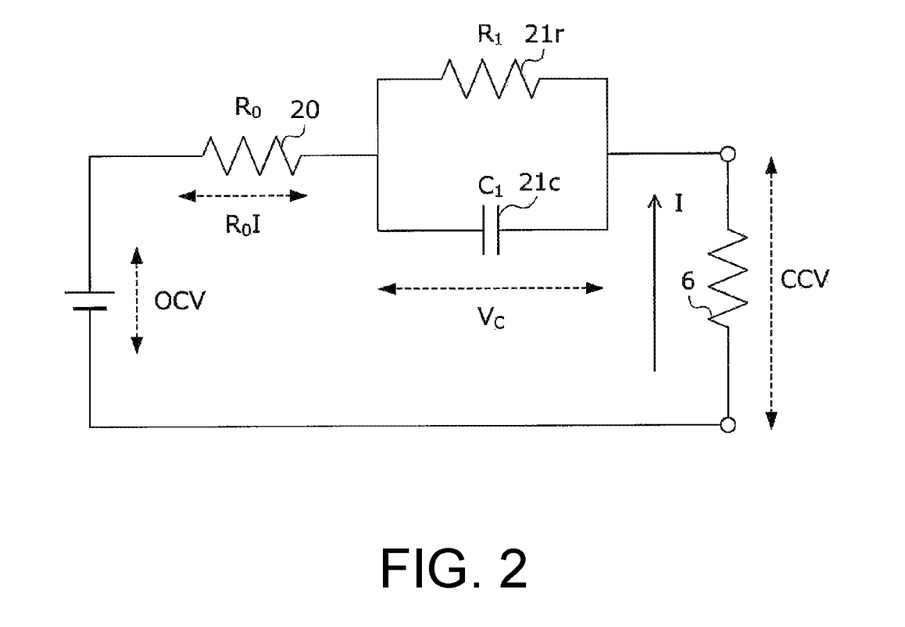
FIG. 2 is a diagram illustrating an example of an equivalent circuit model which is defined in a battery state estimating part.

FIG. 2 is a diagram illustrating an example of an equivalent circuit model which is defined in the battery state estimating part 5. The equivalent circuit model includes an electrolysis resistor 20 which is characterized by a resistance value $R_0$ and an RC parallel circuit including a reaction resistor 21r which is connected in series to the electrolysis resistor 20 and characterized by a resistance value $R_1$ and an electric double-layer capacitor 21c which is characterized by a capacitance value $C_1$. In the following description, the resistance value of the electrolysis resistor 20, the resistance value of the reaction resistor 21r, and the capacitance value of the electric double-layer capacitor 21c are all referred to as model parameters.

In the equivalent circuit model including one stage of RC parallel circuit illustrated in FIG. 2, when value of a current flowing in the battery 1 and the load 6 is defined as "I," a value of the terminal voltage of the battery 1 is defined as "CCV," and a value of an open-circuit voltage of the battery 1 is defined as "OCV," the terminal voltage value CCV is expressed by subtracting a voltage drop ($R_0 I$) in the electrolysis resistor 20 and a voltage drop ($V_C$) in the RC parallel circuit from the open-circuit voltage value OCV as expressed by Equation (1-1). The value of the voltage drop $V_C$ in the RC parallel circuit is expressed by Equation (1-2) in which a current application time is defined as t. Among various physical quantities in the equivalent circuit model illustrated in FIG. 2, the terminal voltage value CCV can be measured by the voltage sensor 4, and the current value I can be measured by the current sensor 3.

$$CCV = OCV - R_0 I - V_C \quad (1\text{-}1)$$

$$V_C = IR_1(1 - e^{-t/R_1 C_1}) \quad (1\text{-}2)$$

Figure 3:
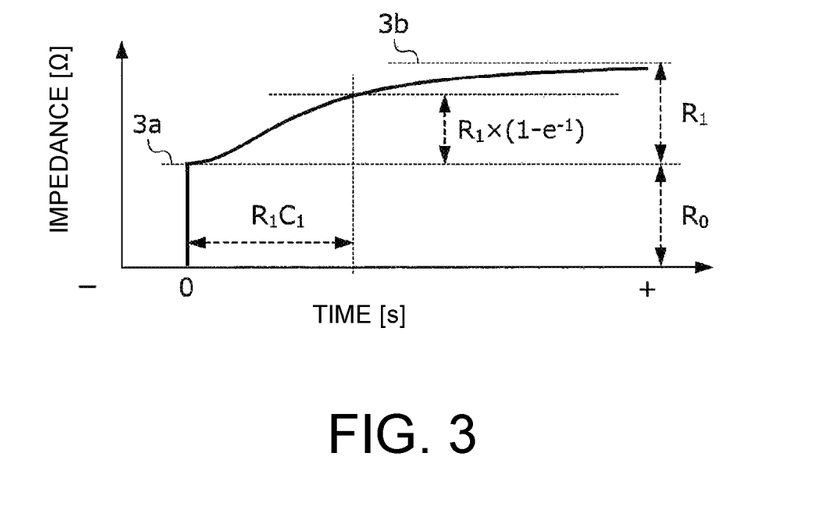
FIG. 3 is a diagram illustrating variation of impedance when a constant current flows in the battery.

FIG. 3 is a diagram illustrating a variation of impedance when a constant current flows in the battery 1 at time O. As illustrated in FIG. 3, the impedance of the battery 1 increases to the magnitude indicated by a dotted line 3a, that is, the resistance value $R_0$ of the electrolysis resistor 20 in the equivalent circuit model illustrated in FIG. 2, immediately after a current starts flowing therein, and then increases gradually to the magnitude indicated by a dotted line 3b, that is, the resistance value $R_1$ of the reaction resistor 21r in the equivalent circuit model illustrated in FIG. 2. In the following description, a time required until the impedance of the battery 1 increases to a resistance value $R_0 + R_1 \times (1 - e^{-1})$ after a current starts flowing, that is, a product of the resistance value $R_1$ of the reaction resistor 21r and the capacitance value $C_1$ of the electric double-layer capacitor 21c in the equivalent circuit model illustrated in FIG. 2, is also referred to as a time constant ($\tau=R_1C_1$).

Figure 4:
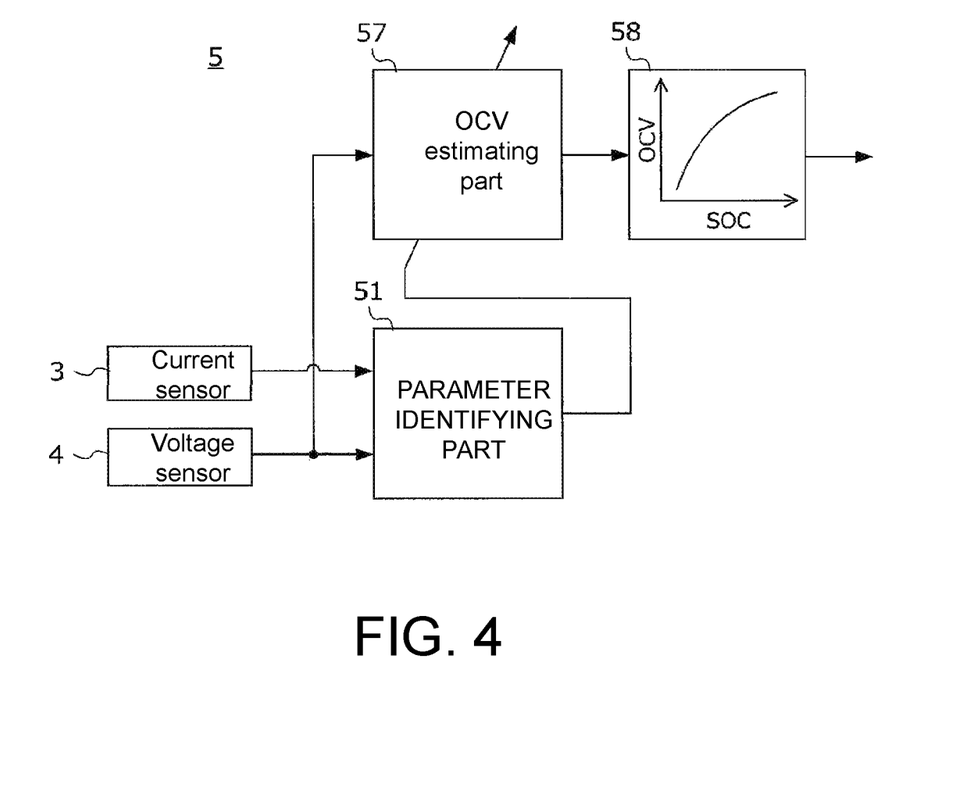
FIG. 4 is a functional block diagram illustrating a configuration of a part associated with estimation of the internal state of the battery in control modules which are embodied in the battery state estimating part.

FIG. 4 is a functional block diagram illustrating a configuration of a part associated with estimation of the internal state of the battery 1 in control modules which are embodied in the battery state estimating part 5.

The battery state estimating part 5 includes a parameter identifying part 51 that identifies values ($R_0$, $R_1$, $C_1$) of model parameters which vary with deterioration of the battery 1 on the basis of detection signals from the current sensor 3 and the voltage sensor 4, an OCV estimating part 57 that estimates an open-circuit voltage of the battery 1 while a current is flowing in the battery 1 using model parameters of which the values have been identified by the parameter identifying part 51, and an SOC estimating part 58 that estimates a state of charge of the battery 1 (which is calculated by expressing a ratio of a residual capacity of the battery 1 to a full charging capacity in terms of percentage) on the basis of the open-circuit voltage estimated by OCV estimating part 57.

The OCV estimating part 57 estimates the open-circuit voltage of the battery 1 which is a parameter for specifying an internal state of the battery 1 on the basis of the equivalent circuit model of FIG. 2. Specifically, the OCV estimating part 57 calculates an estimated value OCV of the open-circuit voltage of the battery 1 by inputting the detection value CCV from the voltage sensor 4 and the values ($R_0$, $R_1$, $C_1$) of the model parameters identified by the parameter identifying part 51 to Equations (1-1) and (1-2).

The SOC estimating part 58 includes an SOC-OCV map in which the open-circuit voltage and the state of charge of the battery 1 are correlated, and estimates the state of charge of the battery 1 which is a parameter for specifying an internal state of the battery 1 using the SOC-OCV map. More specifically, the SOC estimating part 58 calculates an estimated value SOC of the state of charge of the battery 1 by inputting the estimated value OCV of the open-circuit voltage calculated by the OCV estimating part 57 to the SOC-OCV map.

Figure 5:
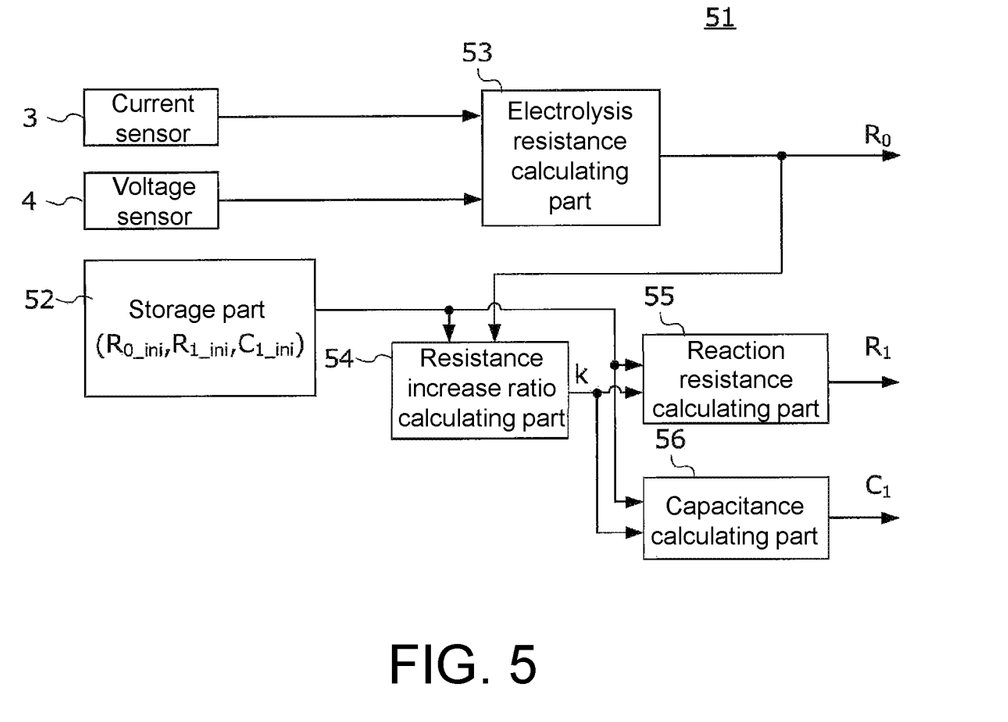
FIG. 5 is a functional block diagram illustrating a configuration of a parameter identifying part.

FIG. 5 is a functional block diagram illustrating a configuration of the parameter identifying part 51. The parameter identifying part 51 includes a storage part 52, an electrolysis resistance calculating part 53, a resistance increase ratio calculating part 54, a reaction resistance calculating part 55, and a capacitance calculating part 56, and calculates the values ($R_0$, $R_1$, $C_1$) of the model parameters which are parameters for specifying the internal state of the battery 1 using these elements.

The storage part 52 stores values of parameters for specifying the internal state of the battery 1 in a predetermined reference state. In this embodiment, the state of the battery 1 at a time point of manufacture, at a time point of mount in a vehicle, or the, that is, the initial state of the battery 1, is set as a reference state, but the disclosure is not limited thereto. For example, the state of the battery 1 at an arbitrary time point during usage thereof may be set as a reference state in consideration of a likelihood that the state of the battery 1 varies or a likelihood that the battery 1 will be replaced during usage thereof. The storage part 52 stores an initial resistance value $R_{0\_ini}$ which is a resistance value of the electrolysis resistor 20 of the battery 1 in the initial state, an initial resistance value $R_{1\_ini}$ which is a resistance value of the reaction resistor 21r of the battery 1 in the initial state, and an initial capacitance value $C_{1\_ini}$ which is a capacitance value of the electric double-layer capacitor 21c of the battery 1 in the initial state.

The electrolysis resistance calculating part 53 calculates a post-deterioration resistance value $R_0$ which is a current resistance value of the electrolysis resistor 20 of the battery 1 after the battery has deteriorated from the initial state using the detection value (I) from the current sensor 3 and the detection value (CCV) from the voltage sensor 4. As described above with reference to FIGS. 2 and 3, since the voltage drop VC in the RC parallel circuit varies transiently with the time constant z with respect to a variation of the current I flowing in the battery 1, the impedance of the battery 1 immediately after the current I has varied is greatly affected by the electrolysis resistor 20. Therefore, the electrolysis resistance calculating part 53 calculates a current variation $\Delta I$ and a voltage variation $\Delta CCV$ over a sampling period which is determined to be sufficiently shorter than the time constant $\tau$ using the detection value from the current sensor 3 and the detection value from the voltage sensor 4, and calculates the post-deterioration resistance value $R_0$ of the electrolysis resistor 20 using the calculated current variation $\Delta I$ and the calculated voltage variation $\Delta CCV$. More specifically, the electrolysis resistance calculating part 53 sequentially calculates the post-deterioration resistance value $R_0$ in accordance with a sequential least square algorithm using the voltage variation $\Delta CCV$ and the current variation $\Delta I$ with a value obtained by dividing the voltage variation $\Delta CCV$ by the current variation $\Delta I$ set to correspond to the post-deterioration resistance value $R_0$ as expressed by Equation (2).

$$R_0 \cong \Delta CCV/\Delta I \qquad (2)$$

As expressed by Equation (3), the resistance increase ratio calculating part 54 calculates a resistance increase ratio k which is a ratio of the post-deterioration resistance value $R_0$ calculated by the electrolysis resistance calculating part 53 to the initial resistance value $R_{0\_ini}$ of the electrolysis resistor 20. The resistance value of the electrolysis resistor 20 is likely to increase as deterioration of the battery 1 progresses. Accordingly, the resistance increase ratio is a parameter representing a degree of deterioration of the battery 1.

$$k = R_0/R_{0\_ini} \qquad (3)$$

The reaction resistance calculating part 55 calculates a post-deterioration resistance value $R_1$ which is a current resistance value of the reaction resistor 21r of the battery 1 after the battery has deteriorated from the initial state using the resistance increase ratio k calculated by the resistance increase ratio calculating part 54 and the initial resistance value $R_{1\_ini}$ of the reaction resistor 21r stored in the storage part 52. More specifically, as expressed by Equation (4), the reaction resistance calculating part 55 calculates the post-deterioration resistance value $R_1$ by multiplying the resistance increase ratio k by the initial resistance value $R_{1\_ini}$.

$$R_1 = R_{1\_ini} \times k \qquad (4)$$

The capacitance calculating part 56 calculates a post-deterioration capacitance value $C_1$ which is a current capacitance value of the electric double-layer capacitor 21c of the battery 1 after the battery has deteriorated from the initial state using the resistance increase ratio k calculated by the resistance increase ratio calculating part 54 and the initial capacitance value $C_{1\_ini}$ of the electric double-layer capacitor 21c stored in the storage part 52. More specifically, as expressed by Equation (5), the capacitance calculating part 56 calculates a post-deterioration capacitance value $C_1$ by dividing the initial capacitance value $C_{1\_ini}$ by the resistance increase ratio k.

$$C_1 = C_{1\_ini}/k \qquad (5)$$

As described above, the reaction resistance calculating part 55 and the capacitance calculating part 56 calculate the post-deterioration resistance value $R_1$ and the post-deterioration capacitance value $C_1$ using the resistance increase ratio such that the time constant $R_1C_1$ which characterizes the RC parallel circuit in the equivalent circuit model is constant regardless of deterioration of the battery 1, that is, such that a product of the initial resistance value $R_{1\_ini}$ and the initial capacitance value $C_{1\_ini}$ is equal to a product of the post-deterioration resistance value $R_1$ and the post-deterioration capacitance value $C_1$ (such that Equation (6) is satisfied). The reaction resistance calculating part 55 calculates the post-deterioration resistance value $R_1$ to increase in proportion to the resistance increase ratio k, and the capacitance calculating part 56 calculates the post-deterioration capacitance value $C_1$ to decrease in inverse proportion to the resistance increase ratio k. In the following description, whether it is valid that the post-deterioration resistance value $R_1$ or the post-deterioration capacitance value $C_1$ is calculated in this way will be reviewed.

$$R_1C_1 = R_{1\_ini}C_{1\_ini} \qquad (6)$$

Figure 6:
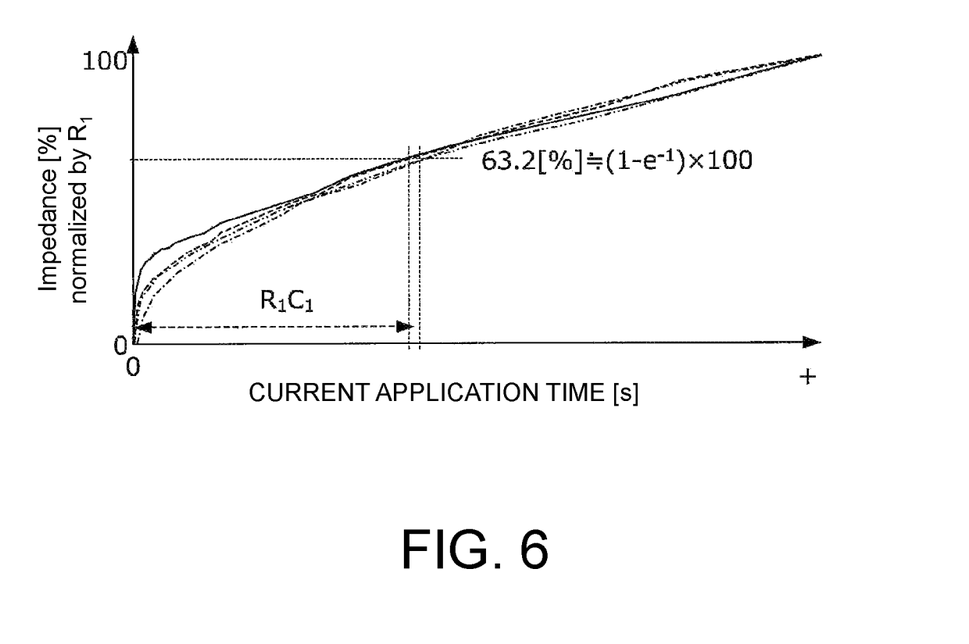
FIG. 6 is a diagram illustrating variation of normalized impedance when a constant current flows in the battery.

FIG. 6 is a diagram illustrating a variation of normalized impedance when a constant current flows in the battery 1 at time 0. In FIG. 6, the vertical axis represents the impedance of the battery 1 which has been normalized using the post-deterioration resistance value $R_1$. In FIG. 6, variations of impedance over time which are acquired for the batteries 1 having different degrees of deterioration are indicated by different types of lines.

As illustrated in FIG. 6, the time required until the impedance which has been normalized using the post-deterioration resistance value $R_1$ reaches about 63.2% (=(1−$e^{-1}$)×100) after flowing of a current starts is substantially constant regardless of the degree of deterioration of the battery 1. That is, the time constant $R_1C_1$ of the battery 1 is likely to be substantially constant even when the battery 1 deteriorates. This means that it is valid that the post-deterioration resistance value $R_1$ and the post-deterioration capacitance value $C_1$ are calculated such that the time constant $R_1C_1$ is constant as described above.

Figure 7:
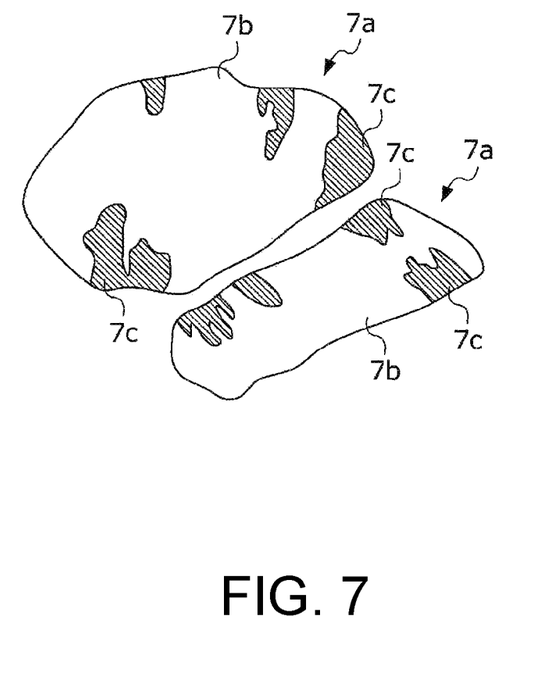
FIG. 7 is a diagram schematically illustrating variation due to deterioration of an active material disposed in an electrode of the battery.

FIG. 7 is a diagram schematically illustrating a variation due to deterioration of an active material 7a disposed in an electrode of the battery 1. As illustrated in FIG. 7, since partial degeneration of the active material occurs with progressing of deterioration of the battery 1, a normal area 7b in which lithium ions react decreases and a degenerated area 7c in which lithium ions cannot react increases. In the degenerated area 7c, cation mixing in which a transition metal such as Ni, Co, or Mn moves to a void of an Li site generated by charging of the battery 1 occurs, and a crystal structure of the active material changes irreversibly a layered rock-salt structure to a spinel structure. Since the active material of the battery 1 exhibits the above-mentioned variation due to deterioration thereof, it is thought that the resistance value of the reaction resistor 21r increases in inverse proportion to a decrease in surface area of the normal area 7b and the capacitance value of the electric double-layer capacitor 21c decreases in proportion to the decrease in surface area of the normal area 7b. This means that it is valid that the post-deterioration resistance value $R_1$ is calculated to increase in proportion to the resistance increase ratio k and the post-deterioration capacitance value $C_1$ is calculated to decrease in inverse proportion to the resistance increase ratio k.

Figure 8:
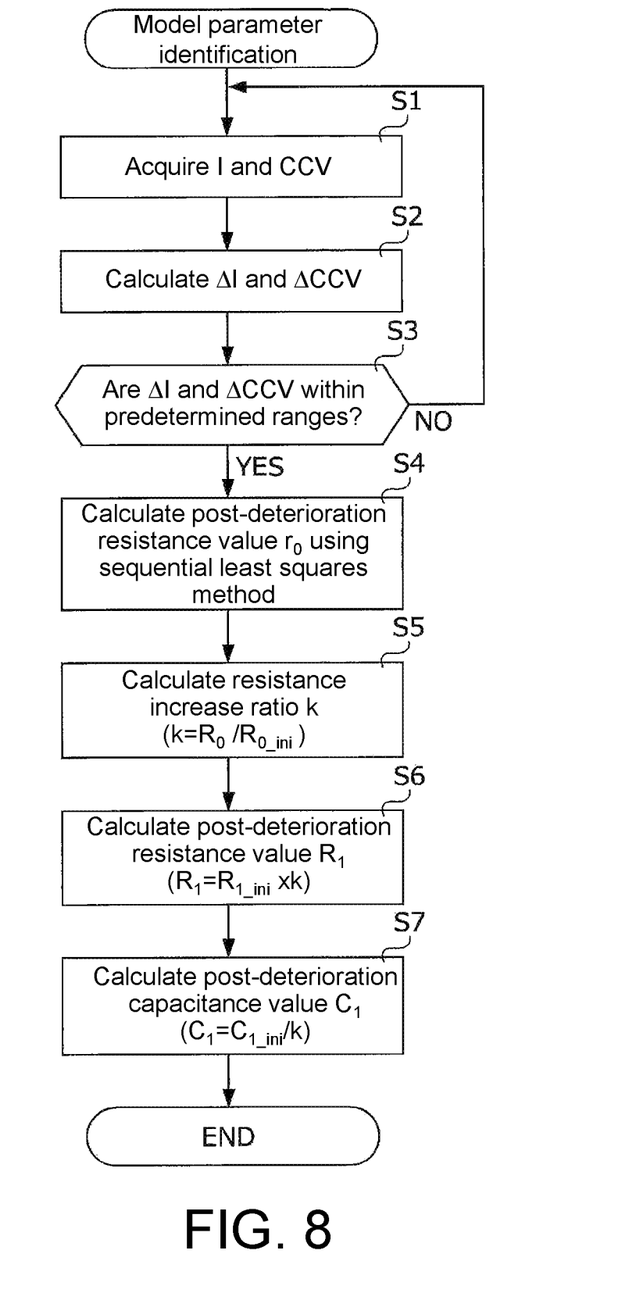
FIG. 8 is a flowchart illustrating a routine for identifying values of model parameters with deterioration of the battery in the parameter identifying part.

FIG. 8 is a flowchart illustrating a routine for identifying values ($R_0$, $R_1$, $C_1$) of model parameters with deterioration of the battery 1 in the parameter identifying part 51. The flowchart illustrated in FIG. 8 is executed by the parameter identifying part 51 at a predetermined cycle.

In S1, the electrolysis resistance calculating part 53 acquires a detection value I from the current sensor 3 and a detection value CCV from the voltage sensor 4, and then the routine transitions to S2. In S2, the electrolysis resistance calculating part 53 calculates a current variation ΔI and a voltage variation ΔCCV using the detection value CCV acquired in Step S1, and then the routine transitions to S3.

In S3, the electrolysis resistance calculating part 53 determines whether the current variation ΔI and the voltage variation ΔCCV calculated in S2 are within predetermined ranges. The routine transitions to S4 when the determination result of S3 is YES, and the routine returns to S1 when the determination result of S3 is NO.

In S4, the electrolysis resistance calculating part 53 calculates a post-deterioration resistance value $R_0$ of the electrolysis resistor 20 on the basis of the sequential least square algorithm using the current variation ΔI and the voltage variation ΔCCV acquired at this cycle, and then the routine transitions to S5.

In S5, the resistance increase ratio calculating part 54 calculates a resistance increase ratio k by dividing the post-deterioration resistance value $R_0$ calculated in S4 by the initial resistance value $R_{0\_ini}$ stored in the storage part 52, and then the routine transitions to S6.

In S6, the reaction resistance calculating part 55 calculates a post-deterioration resistance value $R_1$ of the reaction resistor 21r by multiplying the initial resistance value $R_{1\_ini}$ stored in the storage part 52 by the resistance increase ratio k, and then the routine transitions to S7.

In S7, the capacitance calculating part 56 calculates a post-deterioration capacitance value $C_1$ of the electric double-layer capacitor 21c by dividing the initial capacitance value $C_{1\_ini}$ stored in the storage part 52 by the resistance increase ratio k, and then the routine ends.

With the internal state estimating device 2 according to this embodiment, the following effects can be obtained.

(1) In the internal state estimating device 2, the internal state of the battery 1 which varies with deterioration thereof are expressed by an equivalent circuit model including at least one RC parallel circuit. The electrolysis resistance calculating part 53, the resistance increase ratio calculating part 54, and the reaction resistance calculating part 55 calculate the post-deterioration resistance value $R_1$ of the reaction resistor 21r of the RC parallel circuit on the basis of the detection values from the current sensor 3 and the voltage sensor 4 connected to the battery 1. The capacitance calculating part 56 calculates the post-deterioration capacitance value $C_1$ of the electric double-layer capacitor 21c. As described above, the time constant τ which is a product of the post-deterioration resistance value $R_1$ of the reaction resistor 21r and the post-deterioration capacitance value $C_1$ of the electric double-layer capacitor 21c in the RC parallel circuit included in the equivalent circuit model has characteristics that the time constant does not vary but is substantially constant even when the battery 1 deteriorates. Using these characteristics, the capacitance calculating part 56 calculates the post-deterioration capacitance value $C_1$ such that the product of the initial resistance value $R_{1\_ini}$ of the reaction resistor 21r and the initial capacitance value $C_{1\_ini}$ of the electric double-layer capacitor 21c is equal to the product of the post-deterioration resistance value $R_1$ and the post-deterioration capacitance value $C_1$. As a result, with the internal state estimating device 2, it is possible to accurately estimate the post-deterioration resistance value $R_1$ of the reaction resistor 21r and the post-deterioration capacitance value $C_1$ of the electric double-layer capacitor 21c in the RC parallel circuit representing the internal state of the battery 1 with a small calculation load.

(2) In the internal state estimating device 2, the internal state of the battery 1 which varies with deterioration thereof are expressed by an equivalent circuit model including at least one RC parallel circuit and an electrolysis resistor 20 connected in series to the RC parallel circuit. The electrolysis resistance calculating part 53 calculates the post-deterioration resistance value $R_0$ of the electrolysis resistor 20 on the basis of the detection values from the current sensor 3 and the voltage sensor 4 which are connected to the battery 1. The resistance increase ratio calculating part 54 calculates the resistance increase ratio k which is a ratio of the post-deterioration resistance value $R_0$ to the initial resistance value $R_{0\_ini}$. The reaction resistance calculating part 55 calculates the post-deterioration resistance value $R_1$ of the reaction resistor 21r on the basis of the resistance increase ratio k and the initial resistance value $R_{1\_ini}$ of the reaction resistor 21r. Accordingly, it is possible to calculate the post-deterioration resistance value $R_1$ of the reaction resistor 21r in the RC parallel circuit while curbing an increase in a calculation load.

(3) Deterioration of the battery 1 is thought to progress because partial degeneration of an active material occurs and the surface area of the normal area 7b in which ions can react decreases. The post-deterioration resistance value $R_1$ of the reaction resistor 21r of the RC parallel circuit is thought to increase in proportion to a decrease in the surface area of the normal area 7b in which ions can react and the post-deterioration capacitance value $C_1$ of the electric double-layer capacitor 21c is thought to decrease in proportion to a decrease in the surface area of the normal area 7b. By using such characteristics of deterioration of the battery 1, the reaction resistance calculating part 55 calculates the post-deterioration resistance value $R_1$ of the reaction resistor 21r of the RC parallel circuit by multiplying the initial resistance value $R_{1\_ini}$ thereof by the resistance increase ratio k, and the capacitance calculating part 56 calculates the post-deterioration capacitance value $C_1$ of the electric double-layer capacitor 21c by dividing the initial capacitance value $C_{1\_ini}$ by the resistance increase ratio k. Accordingly, with the internal state estimating device 2, it is possible to accurately estimate the internal state of the battery while curbing an increase in the calculation load.

(4) In the internal state estimating device 2, an estimated value OCV of the open-circuit voltage of the battery 1 is calculated using the detection value CCV from the voltage sensor 4 connected to the battery 1 and the values of three model parameters ($R_0$, $R_1$, $C_1$) which are calculated as described above and which represent the internal state of the battery 1. As a result, with the internal state estimating device 2, it is possible to accurately estimate the open-circuit voltage of the battery 1 even in a state in which a current flows in the battery 1.

(5) In the internal state estimating device 2, the state of charge of the battery 1 is estimated using the open-circuit voltage which is estimated as described above. As a result, with the internal state estimating device 2, it is possible to accurately estimate the state of charge of the battery 1 even in a state in which a current flows in the battery 1.

Second Embodiment

A second embodiment of the disclosure will be described below with reference to the accompanying drawings.

Figure 9:
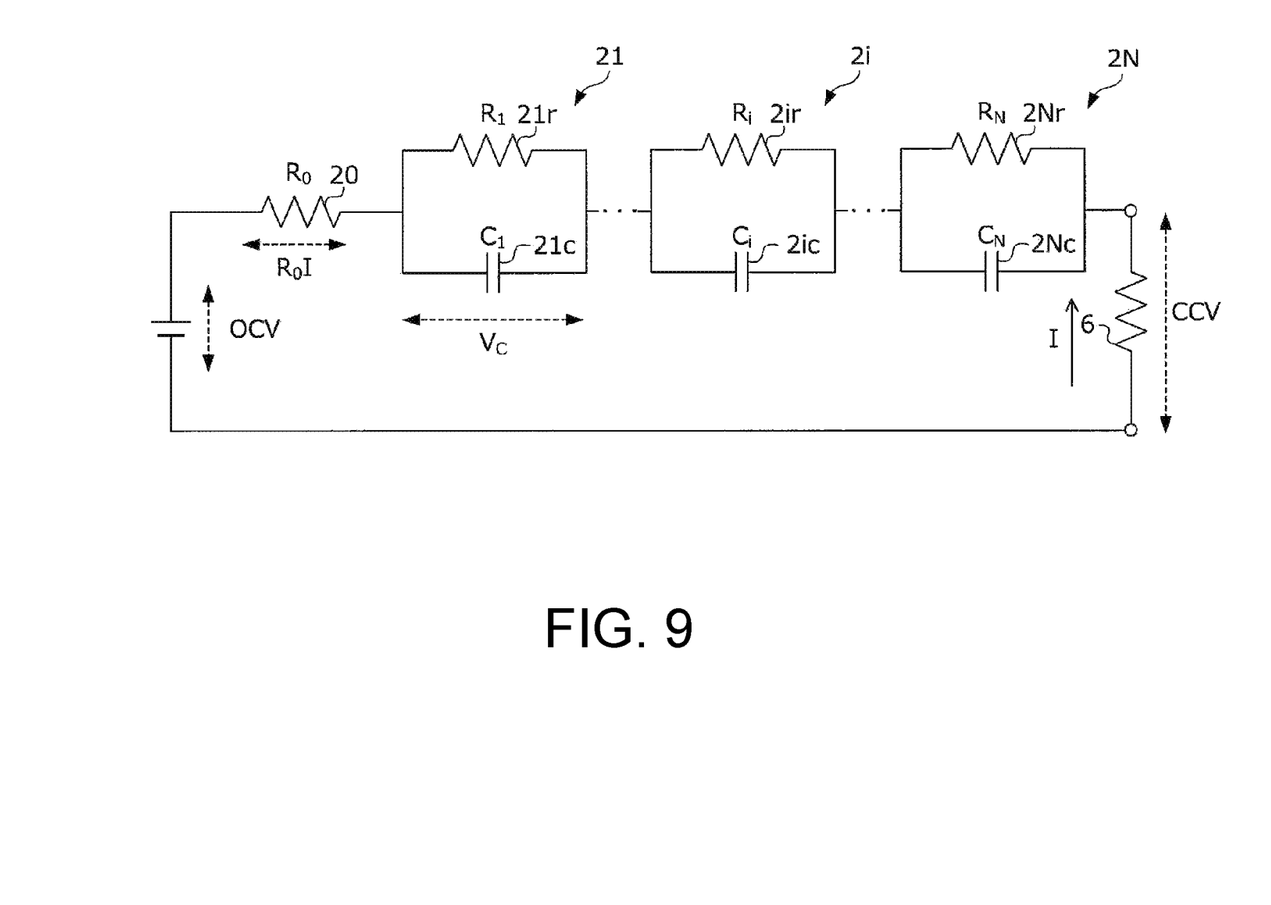
FIG. 9 is a diagram illustrating an example of an equivalent circuit model which is defined in an internal state estimating device according to a second embodiment of the disclosure.

FIG. 9 is a diagram illustrating an example of an equivalent circuit model which is defined in an internal state estimating device 2A according to this embodiment. As illustrated in FIG. 9, the internal state estimating device 2A according to this embodiment is different in the configuration of the equivalent circuit model which is used to estimate the internal state of the battery. In description of the internal state estimating device 2A, the same elements as in the internal state estimating device 2 according to the first embodiment will be referred to by the same reference signs and detailed description thereof will be omitted.

The equivalent circuit model according to this embodiment includes an electrolysis resistor 20 which is characterized by a resistance value $R_0$ and N stages (where N is an integer equal to or greater than 2) of RC parallel circuits 21, ..., 2N which are connected in series to the electrolysis resistor 20. The i-th stage (where i is an integer ranging from 1 to N) of RC parallel circuit 2i includes a reaction resistor 2ir which is characterized by a resistance value $R_i$ and an electric double-layer capacitor 2ic which is characterized by a capacitance value $C_1$.

Figure 10:
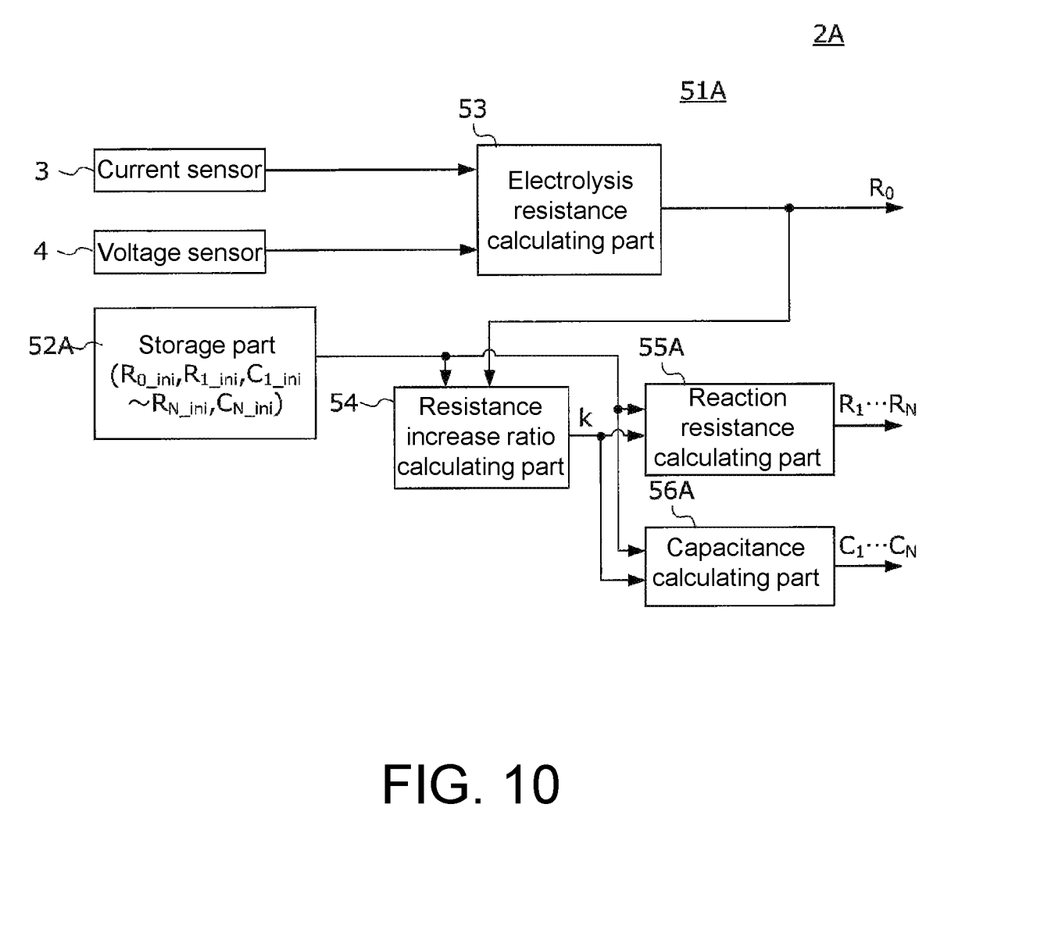
FIG. 10 is a diagram illustrating a configuration of a parameter identifying part of the internal state estimating device according to the second embodiment.

FIG. 10 is a functional block diagram illustrating a configuration of a parameter identifying part 51A of the internal state estimating device 2A according to this embodiment. The parameter identifying part 51A includes a storage part 52A, an electrolysis resistance calculating part 53, a resistance increase ratio calculating part 54, a reaction resistance calculating part 55A, and a capacitance calculating part 56A, and calculates values ($R_0$, $R_1$, $C_1$, ..., $R_N$, $C_N$) of 2N+1 model parameters which are parameters for specifying the internal state of the battery 1 using these elements.

The storage part 52A stores an initial resistance value $R_{0\_ini}$ which is a resistance value of the electrolysis resistor 20 of the battery 1 in the initial state, an initial resistance value $R_{i\_ini}$ which is a resistance value of the reaction resistor 2ir of the i-th (where i is an integer ranging from 1 to N) stage of RC parallel circuit of the battery 1 in the initial state, and an initial capacitance value $C_{i\_ini}$ which is a capacitance value of the electric double-layer capacitor 2ic of the same RC parallel circuit in the initial state.

The reaction resistance calculating part 55A calculates post-deterioration resistance values $R_1$ to $R_N$ which are current resistance values of the reaction resistor 21r to 2Nr of the battery 1 after the battery has deteriorated from the initial state using the resistance increase ratio k calculated by the resistance increase ratio calculating part 54 and the initial resistance values $R_{1\_ini}$ to $R_{N\_ini}$ of the reaction resistors 21r to 2Nr stored in the storage part 52A. More specifically, as expressed by Equation (7), the reaction resistance calculating part 55A calculates the post-deterioration resistance value $R_1$ of the reaction resistor 2ir of the i-th stage of RC parallel circuit by multiplying the initial resistance value $R_{1\_ini}$ By the resistance increase ratio k.

$$R_i = R_{i\_ini} \times k \quad (7)$$

The capacitance calculating part 56A calculates a post-deterioration capacitance values $C_1$ to $C_N$ which are current capacitance values of the electric double-layer capacitors 21c to 2Nc of the battery 1 after the battery has deteriorated from the initial state using the resistance increase ratio k calculated by the resistance increase ratio calculating part 54 and the initial capacitance values $C_{1\_ini}$ to $C_{N\_ini}$ of the electric double-layer capacitors 21c to 2Nc stored in the storage part 52A. More specifically, as expressed by Equation (8), the capacitance calculating part 56A calculates the post-deterioration capacitance value $C_i$ of the electric double-layer capacitor $2ic$ of the i-th stage of RC parallel circuit by dividing the initial capacitance value $C_{i\_ini}$ by the resistance increase ratio k.

$$C_i = C_{i\_ini}/k \qquad (8)$$

With the internal state estimating device 2A according to this embodiment, the following effects are obtained in addition to the effects of (1) to (5).

(6) In the internal state estimating device 2A, the internal state of the battery which varies with deterioration thereof are expressed by an equivalent circuit model including the electrolysis resistor 20 and N stages of RC parallel circuits 21 to 2N which are equal to or greater than two stages. Accordingly, with the internal state estimating device 2A, it is possible to more accurately reproduce the internal state of the battery which varies with deterioration thereof than those in the internal state estimating device 2. When the equivalent circuit model is expressed using N stages of RC parallel circuits, the number of model parameters of the equivalent circuit model is 2N+1 and thus there is a likelihood that the calculation load will increase greatly. On the other hand, in the internal state estimating device 2A, since the post-deterioration resistance value $R_1$ to $R_N$ and the post-deterioration capacitance values $C_1$ to $C_N$ of the stages of RC parallel circuits can be calculated using the resistance increase ratio k and the initial values $R_{1\_ini}$ to $R_{N\_ini}$ and $C_{1\_ini}$ to $C_{N\_ini}$ stored in the storage part 52A, it is possible to accurately estimate the internal state of the battery while curbing an increase in the calculation load.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An internal state estimating device that estimates an internal state of a battery which has varied with use thereof, comprising:
    a storage part that stores a reference parallel resistive component and a reference parallel capacitive component in at least one RC parallel circuit comprised in an equivalent circuit model of the battery;
    a first internal state estimating part that calculates one varying component from a varying parallel resistive component and a varying parallel capacitive component on the basis of a detection value from a sensor connected to the battery; and
    a second internal state estimating part that calculates the other varying component of the varying parallel resistive component and the varying parallel capacitive component such that a product of the reference parallel resistive component and the reference parallel capacitive component is equal to a product of the one varying component and the other varying component,
    wherein the equivalent circuit model comprises a series resistor which is connected in series to the at least one RC parallel circuit,
    wherein the storage part stores a reference series resistive component, and
    wherein the first internal state estimating part calculates a varying series resistive component on the basis of the detection value from the sensor and calculates the one varying component on a basis of a series resistance increase ratio and a reference component, wherein the series resistance increase ratio is a ratio of the varying series resistive component to the reference series resistive component,
    wherein the varying parallel resistive component is calculated by multiplying the reference parallel resistive component by the series resistance increase ratio and the varying parallel capacitive component is calculated by dividing the reference parallel capacitive component by the series resistance increase ratio.

2. The internal state estimating device according to claim 1, wherein the equivalent circuit model comprises N (where N is an integer equal to or greater than 2) stages of RC parallel circuits,
    wherein the storage part stores a reference parallel resistive component and a reference parallel capacitive component in each stage of RC parallel circuit,
    wherein the first internal state estimating part calculates one varying component from a varying parallel resistive component and a varying parallel capacitive component in each stage of RC parallel circuit, and
    wherein the second internal state estimating part calculates the other varying component such that a product of the reference parallel resistive component and the reference parallel capacitive component in each stage of RC parallel circuit is equal to a product of the one varying component and the other varying component.

3. The internal state estimating device according to claim 1, further comprising an open-circuit voltage estimating part that estimates an open-circuit voltage of the battery on a basis of a detection value from a voltage sensor connected to the battery and the varying series resistive component, the varying parallel resistive component, and the varying parallel capacitive component which are calculated by the first and second internal state estimating parts.

4. The internal state estimating device according to claim 3, further comprising a state-of-charge estimating part that estimates a state of charge of the battery on a basis of the open-circuit voltage of the battery estimated by the open-circuit voltage estimating part.

* * * * *